(12) United States Patent
Shinkawata

(10) Patent No.: US 6,759,720 B2
(45) Date of Patent: Jul. 6, 2004

(54) SEMICONDUCTOR DEVICE WITH TRANSFER GATE HAVING GATE INSULATING FILM AND GATE ELECTRODE LAYER

(75) Inventor: Hiroki Shinkawata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/766,846

(22) Filed: Jan. 23, 2001

(65) Prior Publication Data

US 2002/0008324 A1 Jan. 24, 2002

(30) Foreign Application Priority Data

Jul. 21, 2000 (JP) ........................................ 2000-220609

(51) Int. Cl.⁷ .................... H01L 29/76; H01L 29/94; H01L 23/48
(52) U.S. Cl. .................. 257/413; 257/300; 257/303; 257/306; 257/383; 257/384; 257/412; 257/774
(58) Field of Search ........................ 257/296, 300, 257/301, 303, 304, 306, 309, 382, 383, 384, 408, 412, 413, 752, 773, 774, 775, 776; 438/238, 239, 386, 399, 250, 393, 243, 244, 253, 387, 396, 255, 398

(56) References Cited

U.S. PATENT DOCUMENTS 5,693,974 A * 12/1997 Hsu et al. .................... 257/369
5,796,166 A * 8/1998 Agnello et al. .............. 257/369
6,025,227 A * 2/2000 Sung ........................... 438/253
6,051,859 A * 4/2000 Hosotani et al. ............. 257/306
6,093,590 A * 7/2000 Lou ............................ 438/197
6,100,137 A * 8/2000 Chen et al. ................... 438/253
6,104,052 A * 8/2000 Ozaki et al. .................. 257/296
6,137,130 A * 10/2000 Sung ........................... 257/306
6,174,803 B1 * 1/2001 Harvey ........................ 438/638
6,329,232 B1 * 12/2001 Yang et al. ................... 438/197
6,369,446 B1 * 4/2002 Tanaka ........................ 257/753

FOREIGN PATENT DOCUMENTS

| JP | 11-26757 | 1/1999 |
| JP | 11-135745 | 5/1999 |
| KR | 1999-0084554 | 12/1999 |

OTHER PUBLICATIONS

Nikkei Microdevices, Jul., 1999, pp. 46–51 (with English abstract).

* cited by examiner

Primary Examiner—Hung Vu
(74) Attorney, Agent, or Firm—McDermott, Will & Emery

(57) ABSTRACT

Transfer gate (TG) holding trenches are defined in a first interlayer insulating film 44 formed on a silicon substrate 10. TG 33 including side walls 34 are formed in their corresponding trenches. Contact holes are defined in portions adjacent to the TG 33 in a self-aligned manner on the condition that the first interlayer insulating film 44 is selectively removed. Contact plugs 50 are formed in their corresponding contact holes. Bit lines 60 respectively conducted over or to the contact plugs 50 and capacitors are formed over these.

15 Claims, 17 Drawing Sheets

Fig. 1A
Fig. 1B
Fig. 1C
STEP1~3
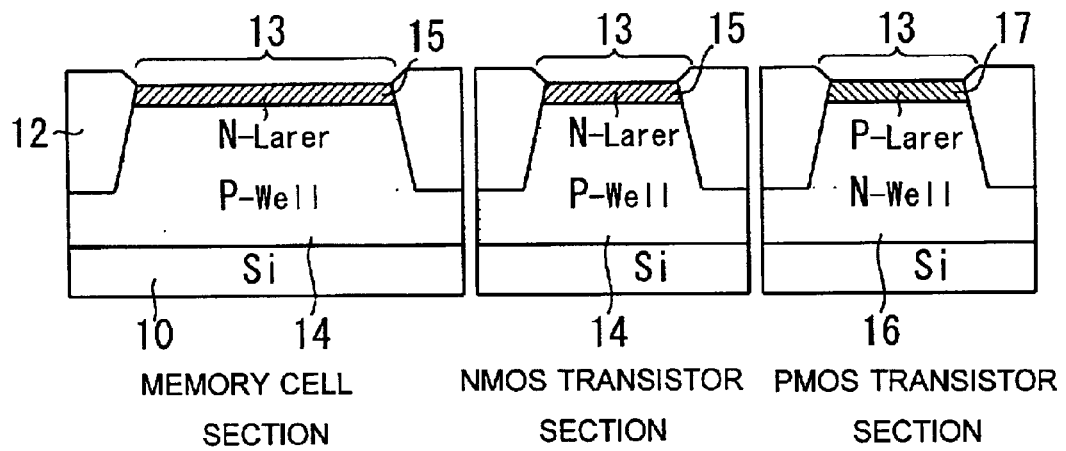
MEMORY CELL SECTION    NMOS TRANSISTOR SECTION    PMOS TRANSISTOR SECTION
Fig. 2A
Fig. 2B
Fig,. 2C
STEP4, 5
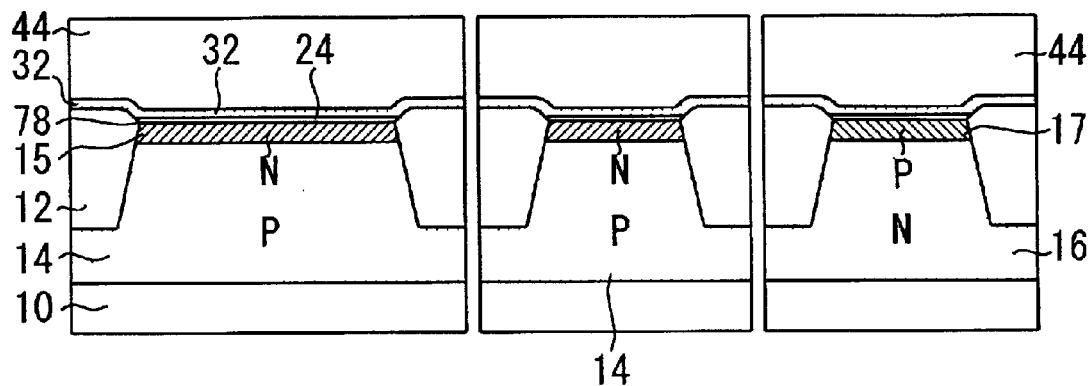

STEP6

STEP7

STEP8
STEP9

STEP10

STEP11

STEP12

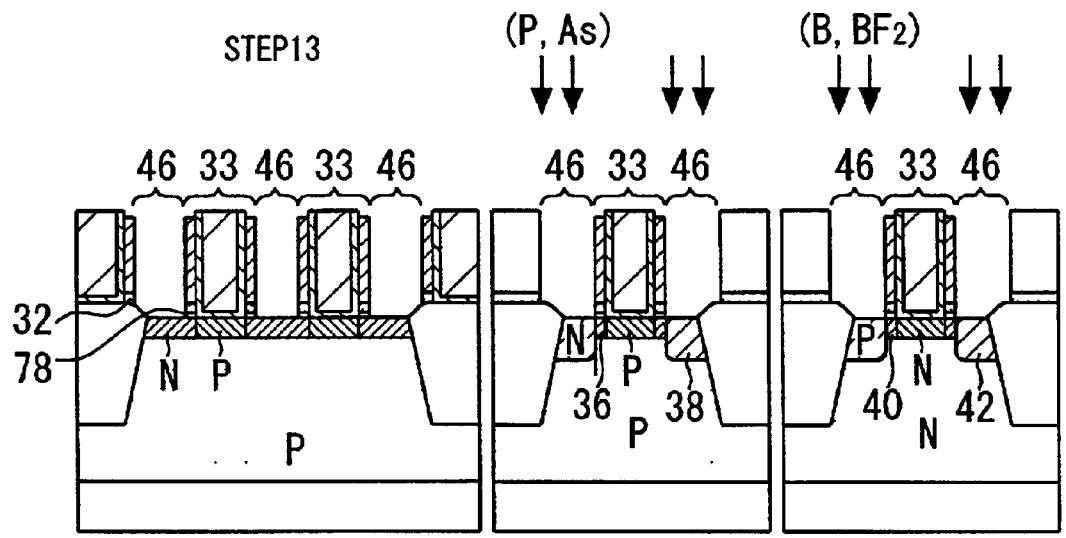
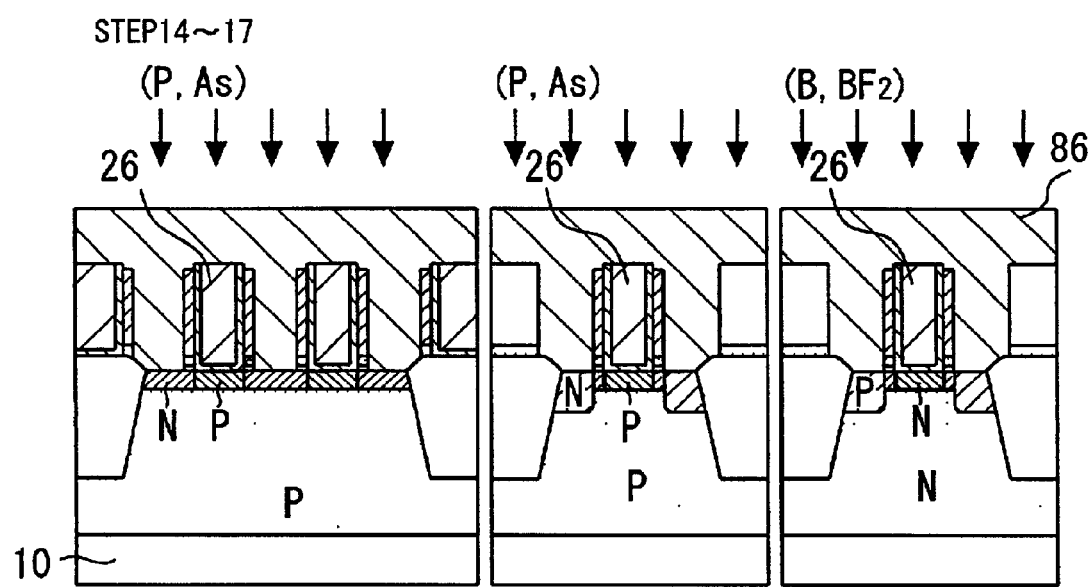

STEP18

STEP19~21

(a)   (b)   (c)

Fig. 22A  Fig. 22B  Fig. 22C
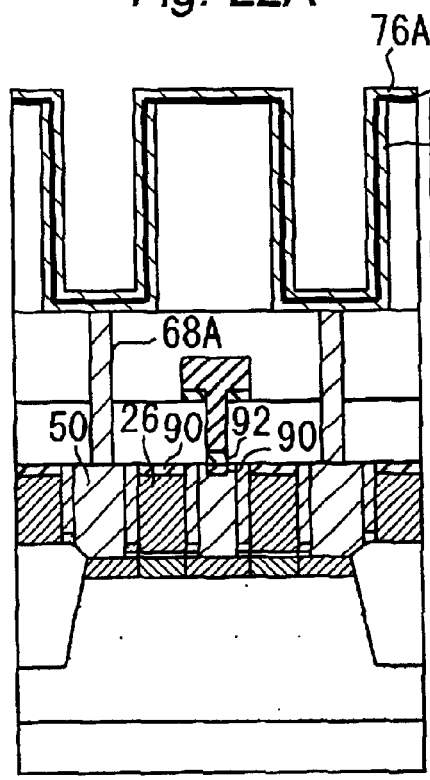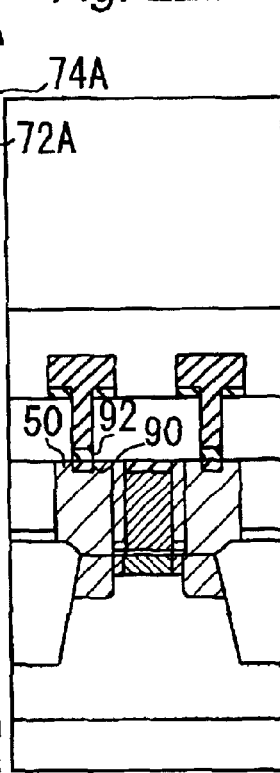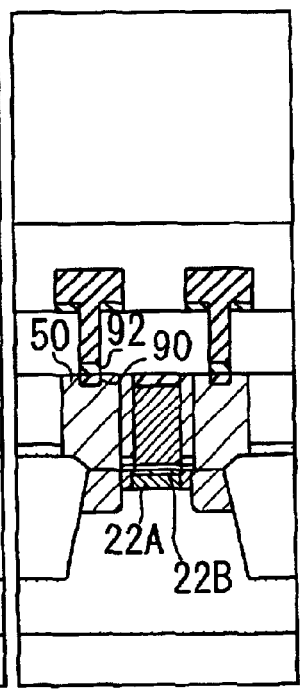
Fig. 23A  Fig. 23B  Fig. 23C
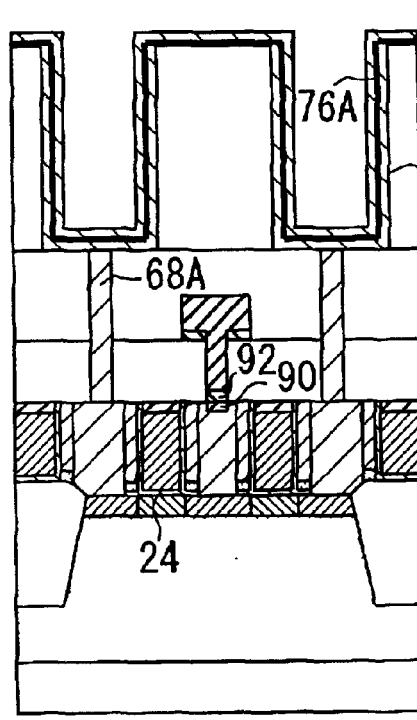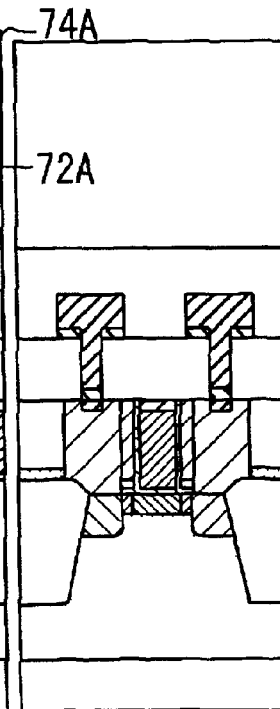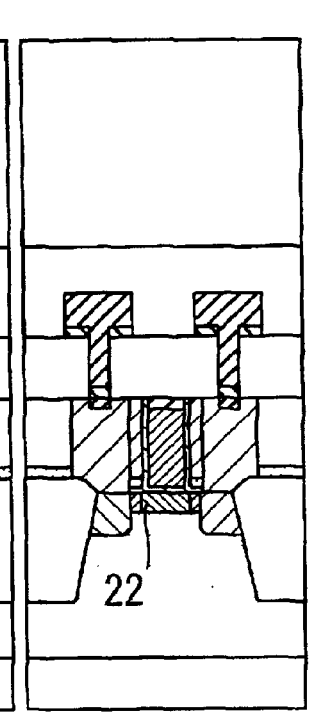

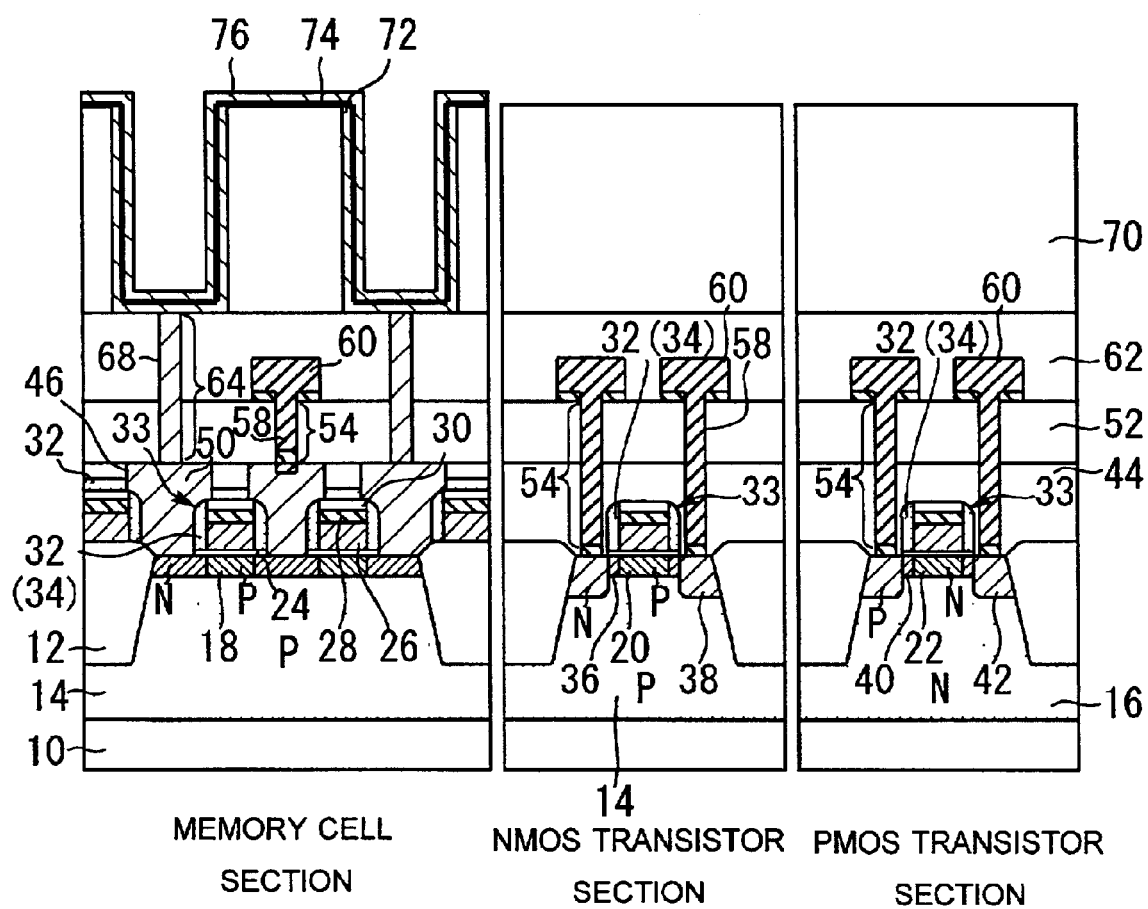

*Fig. 28A* PRIOR ART    *Fig. 28B* PRIOR ART    *Fig. 28C* PRIOR ART
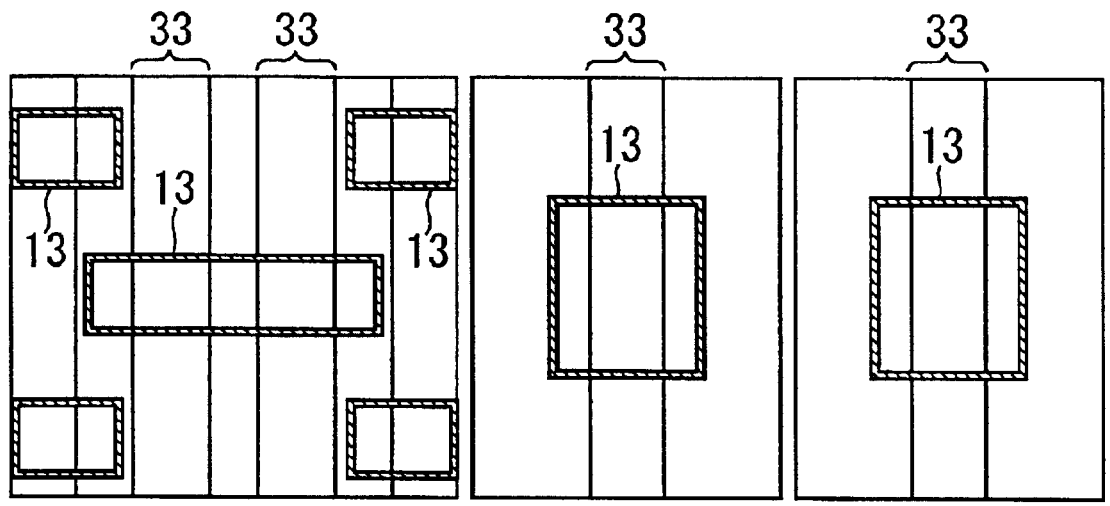
*Fig. 29A* PRIOR ART    *Fig. 29B* PRIOR ART    *Fig. 29C* PRIOR ART
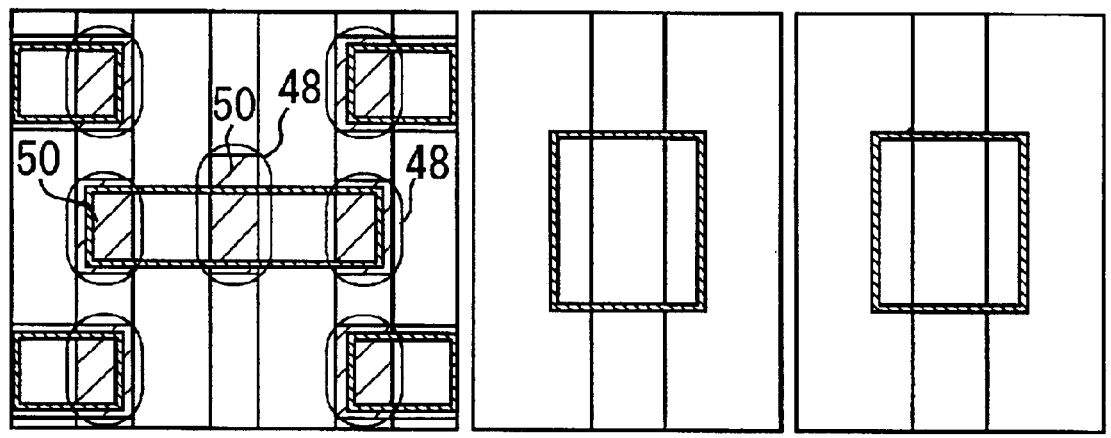

SEMICONDUCTOR DEVICE WITH TRANSFER GATE HAVING GATE INSULATING FILM AND GATE ELECTRODE LAYER

BACKGROUND OF THE INVENTION

1. Field of the Invention

The present invention relates to a semiconductor device and a method of manufacturing the same, and particularly to a semiconductor device having contact holes defined in a self-aligned manner and a method of manufacturing the same.

2. Description of the Background Art

In the field of a semiconductor device typified by a DRAM (Dynamic Random Access Memory), a design size thereof has recently been reduced with a progress in scale down thereof. With a reduction in design size, a memory device such as the DRAM or the like needs to form both contact holes (capacitor contacts) which lead to capacitors for memory cells, and contact holes (BL contacts) which lead to bit lines, as a self alignment contact (SAC) structure.

In a COB (Capacitor Over Bit-line) structure which is currently in vogue for a DRAM's structure, a capacitor contact normally has a depth of about 1 µm. By a feasible etching selection ratio or the like, it is then not always easy to form the capacitor contact having the 1 µm-depth in a suitable position in a self-aligned manner. Therefore, a method of forming first contact plugs in a self-aligned manner and defining contact holes (diameter-reduced contacts) small in diameter on the first contacts might be used as a method of manufacturing the DRAM having the COB structure. According to the method referred to above, since the depths of the contact holes to be defined at a time are reduced, difficulties accompanied by the formation of the capacitor contacts can be relieved.

FIG. 27A is a cross-sectional view of a memory cell section of an embedded DRAM device manufactured by the conventional method referred to above. FIGS. 27B and 27C respectively show cross-sectional views of a CMOS (Complementary Metal Oxide Semiconductor) formed in a logic circuit section include in the embedded DRAM device. More specifically, FIG. 27B is a cross-sectional view of an NMOS transistor section in the logic circuit section, and FIG. 27C is a cross-sectional view of a PMOS transistor section in the logic circuit section, respectively.

Further, FIGS. 28A through 28C, FIGS. 29A through 29C and FIGS. 30A through 30C are drawings for respectively describing layouts of the embedded DRAM device in accordance with the progress of manufacturing processes. The flow of the processes used upon manufacturing the embedded DRAM device by the conventional method will be explained below with reference to these drawings.

Step 101: Insulating isolation films 12 are formed on a silicon substrate 10. As a result, active regions designated at numerals 13 in FIGS. 28A through 28C are formed.

Step 102: A P-type well 14 is formed in each of a memory cell section and an NMOS transistor section. A P-type channel is introduced into a surface region of the P-type well 14.

Step 103: An N-type well 16 is formed in a PMOS transistor section. An N-type channel (P-type channel layer in the case of a buried channel type) is introduced into a surface region of the N-type well 16.

Step 104: A gate insulating film 24 is formed so as to cover the surfaces of the active regions.

Step 105: A conductive gate electrode film 26, a polycide film 28, and a silicon insulating film 30 which serves as a mask for the gate electrode film 26, are formed over the gate insulating film 24.

Step 106: The silicon insulating film 30 is etched by a resist mask. The gate electrode film 26 and the polycide film 28 are etched with each processed silicon insulating film 30 as a mask. In order to form an N-type impurity layer 36 and a P-type impurity layer 40 in the memory cell section, the NMOS transistor section and the PMOS transistor section respectively, impurities are introduced into those regions in a self-aligning manner with respect to gate electrodes by using masks.

Step 107: A silicon nitride film 32 is formed so as to cover the whole surface of the semiconductor wafer. As a result, transfer gates (TG) 33 covered with the silicon nitride film 32 are formed in all of the memory cell section, the NMOS transistor section and the PMOS transistor section (see FIGS. 28A through 28C).

Step 108: The silicon nitride film 32 for covering the NMOS transistor section and the PMOS transistor section is anisotropically etched to thereby form in those regions side walls 34 which cover the sides of the gate electrode films 26.

Step 109: An N-type impurity and a P-type impurity are respectively introduced into the NMOS transistor section and the PMOS transistor section. As a result, an N− region 36 and an N+ region 38 are formed in the NMOS transistor section, whereas a P− region 40 and a P+ region 42 are formed in the PMOS transistor section.

Step 110: A first interlayer insulating film 44 is deposited on the whole surface of the semiconductor wafer.

Step 111: In the memory cell section, contact holes 46 are formed between the gate electrode films 26 in a self-aligned manner with the silicon nitride film 32 as a stopper film. Subsequently, etching for removing the stopper film 32 at the bottom of each contact hole is carried out to form the contact holes 46. At this time, the side walls 34 for covering the sides of each gate electrode film 26 are formed even in the memory cell section. Using mask patterns designated at numerals 48 in FIG. 29A forms the contact holes 46.

Step 112: Doped polysilicon is embedded inside the contact holes 46 to form conductive contact plugs 50 between the adjacent TGs 33.

Step 113: A second interlayer insulating film 52 is formed over the first interlayer insulating film 44 and the contact plugs 50.

Step 114: BL contacts 54, which lead to their corresponding bit lines, are formed in the memory cell section, the NMOS transistor section and the PMOS transistor section. The BL contacts 54 are formed by using mask patterns designated at numerals 56 in FIGS. 30A through 30C.

Step 115: Contact plugs 58 are formed inside their corresponding BL contacts 54, then bit lines 60 are patterned on the second interlayer insulating film 52.

Step 116: A third interlayer insulating film 62 is formed so as to cover the bit lines 60.

Step 117: Capacitor contacts 64, which extend through the second and third interlayer insulating films 52 and 62 and are opened above the contact plugs 50, are formed in the memory cell section. The capacitor contacts 64 are formed by using mask patterns designated at numerals 66 in FIGS. 30A through 30B.

Step 118: Doped polysilicon or W or the like is embedded inside the capacitor contacts 64 to thereby form conductive contact plugs 68.

Step 119: A fourth interlayer insulating film 70 is formed over the third interlayer insulating film 62.

Step 120: Lower electrodes 72, which conduct to the contact plugs 68, an insulating film 74 for covering the lower electrodes 72, and an upper electrode 76 for covering the insulating film 74 are formed in the memory cell section. According to the conventional manufacturing method, an embedded memory device equipped with the DRAM having the COB structure is manufactured by executing the aforementioned series of processes.

With high integration of an embedded memory logic device, a source-drain region of a logic circuit section has been reduced or scaled down in recent years. Namely, the N+ region 38 shown in FIG. 27B and the P+ region 42 shown in FIG. 27C have been reduced. It is therefore desirable to form not only the capacitor contacts in the memory cell section but also the BL contacts in the logic circuit section as the SAC structure as regarding the embedded memory logic device. However, the conventional method referred to above cannot form the BL contacts 54 in the logic circuit section as the SAC structure.

It is necessary for the conventional manufacturing method to deposit the silicon nitride film 32 on the silicon substrate 10 and thereafter deposit the first interlayer insulating film 44 such that spaces between the adjacent TGs 33 are buried. An interval between the TG 33 becomes narrow as the design size of the DRAM decreases. On the other hand, when the design size of the DRAM decreases, it is necessary to increase the height of the TG 33 for the purpose of suppressing electrical resistance of the gate electrode film 26. Therefore, a recent DRAM shows the tendency that an aspect ratio of the space ensured between the adjacent TGs 33 increases. When the aspect ratio of the space between the TGs 33 increases, it is difficult to bury its interior by the first interlayer insulating film 44. Thus, the conventional method is accompanied by a problem that the first interlayer insulating film 44 cannot properly be deposited as the scale down of the DRAM progresses.

Further, in the conventional method, such mask patterns 48 as shown in FIG. 29A, i.e., mask patterns 48 having separate openings for individual contact holes 46 are used to open the contact holes 46 between the adjacent TGs 33 in a self-aligned manner. When such mask patterns 48 are used over the TG 33 formed with narrow pitches, a short circuit is apt to occur between the adjacent contact holes 46 where, for example, the flatness of the interlayer insulating film is degraded. Even in this point of view, the conventional manufacturing method had a problem in terms of the manufacture of a scaled-down or micro DRAM.

SUMMARY OF THE INVENTION

The present invention has been made to solve the above-described problems. A first object of the present invention is to provide a semiconductor device having a structure suitable for the reliable formation of a miniaturized DRAM.

Further, a second object of the present invention is to provide a method of manufacturing a semiconductor device, which is suitable for the reliable formation of a miniaturized DRAM.

The above objects of the present invention are achieved by a semiconductor device described below. The semiconductor device includes transfer gates and contact plugs adjacent to the transfer gates. The each transfer gate has a gate insulating film, a gate electrode layer, and side walls for covering sides of the gate insulating film and the gate electrode layer. The each contact plug has the same height as the transfer gate and is adjacent to the transfer gate over the whole height. The semiconductor device also includes a first interlayer insulating film having a surface which defines the same surface as the surface of the transfer gate and the surface of the contact plug. A second interlayer insulating film is formed on the first interlayer insulating film. The semiconductor device further includes diameter-reduced contact plugs which are smaller than the contact plugs and extend through the second interlayer insulating film to conduct to the contact plugs, respectively.

The above objects of the present invention are also achieved by a method of manufacturing a semiconductor device having contact plugs adjacent to transfer gates. In the inventive method, a first interlayer insulating film is deposited on a silicon substrate. Transfer gate holding trenches is formed in the first interlayer insulating film. Side walls of the each transfer gate are formed in the transfer gate holding trenches. A gate insulating film and a gate electrode layer of the each transfer gate is formed within a space interposed between the side walls. Portions adjacent to the transfer gates of the first interlayer insulating film is etched under a condition that the first interlayer insulating film is capable of being removed at a high selectivity with respect to a material which constitutes the each transfer gate, to thereby form contact holes adjacent to the transfer gates in a self-aligned manner. Contact plugs are formed in the contact holes respectively. A second interlayer insulating film is formed on the first interlayer insulating film, the contact plugs and the transfer gates. Diameter-reduced contact holes which are smaller than the contact plugs and in communication with the contact plugs are formed in the second interlayer insulating film. Diameter-reduced contact plugs which conduct to the contact plugs are formed in the diameter-reduced contact holes.

Other objects and further features of the present invention will be apparent from the following detailed description when read in conjunction with the accompanying drawings.

BRIEF DESCRIPTION OF THE DRAWINGS

FIGS. 1A through 14C are sectional views for describing a flow of a method of manufacturing a semiconductor device according to a first embodiment of the present invention;

FIGS. 15A through 17C are plan views for describing layouts of the semiconductor device employed in the first embodiment of the present invention;

FIGS. 22A through 22C are sectional views for describing a method of manufacturing a semiconductor device according to a sixth embodiment of the present invention;

FIGS. 23A through 23C are sectional views for describing a method of manufacturing a semiconductor device according to a seventh embodiment of the present invention;

FIGS. 27A through 27C are sectional views for describing a conventional method of manufacturing a semiconductor device; and FIGS. 28A through 30C are plan views for describing layouts of the conventional semiconductor device.

DESCRIPTION OF THE PREFERRED EMBODIMENTS

BEST MODE OF CARRYING OUT THE INVENTION

Figures 3A, 3B, 3C:
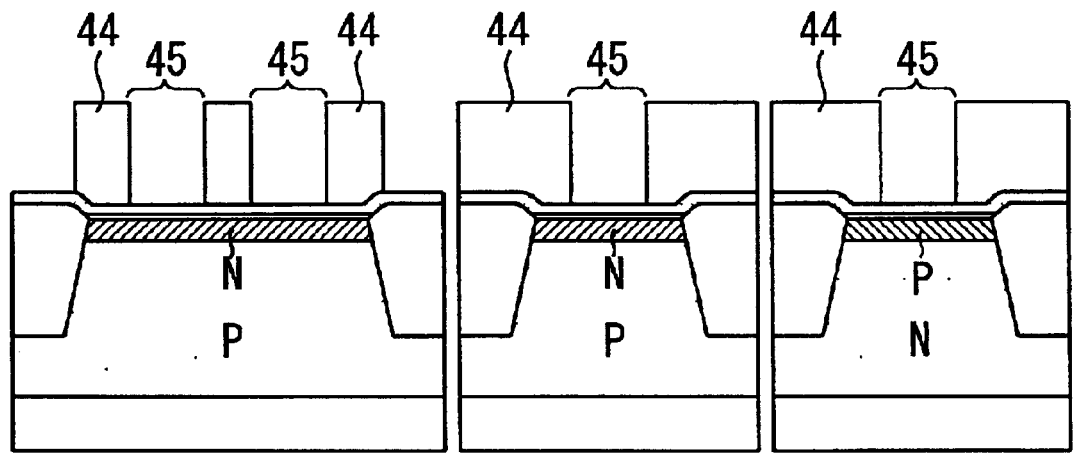

Embodiments of the present invention will hereinafter be described with reference to the accompanying drawings. Incidentally, elements common in the respective drawings are identified by the same reference numerals and the description of certain common elements will therefore be omitted.

First Embodiment

FIGS. 1A through 14C are respectively sectional views for describing a method of manufacturing a semiconductor device according to a first embodiment of the present invention. Further, FIGS. 15A through 17C are respectively plan views for describing layouts of an embedded DRAM device manufactured by the present embodiment in accordance with the progress of a manufacturing process.

In the first embodiment, a semiconductor device, i.e., an embedded DRAM device provided with a DRAM and a logic device on the same substrate, is manufactured. Among FIGS. 1A through 17C, FIGS. iA (i=1 through 17) respectively show cross-sections of a memory cell section of the embedded DRAM device. FIGS. iB and FIGS. iC (i=1 through 17) respectively show cross-sections of a CMOS, more specifically, cross-sections of an NMOS transistor section and a PMOS transistor section of a logic circuit section.

In the present embodiment, the embedded DRAM device is fabricated according to the following procedures.

Step 1: As shown in FIGS. 1A through 1C, insulating isolation films 12 are formed over a silicon substrate 10. As a result, active regions 13 are formed in respective regions on a semiconductor wafer (see layouts of FIGS. 15A through 15C).

Step 2: A P-type well 14 is formed in each of the memory cell section and the NMOS transistor section. Next, an N-impurity is introduced into a surface region of the P-type well 14 to form an N-type diffused layer 15.

Step 3: An N-type well 16 is formed in the PMOS transistor section. Next, a P-impurity is introduced into a surface region of the N-type well 16 to form a P-type diffused layer 17.

Step 4: As shown in FIGS. 2A through 2C, a silicon oxide film 78 and a silicon nitride film 32 are formed in piles on each of the active regions 13 of the memory cell section, NMOS transistor section and PMOS transistor section.

Step 5: A first interlayer insulating film 44 is formed over the silicon nitride film 32 by using a TEOS oxide film or BPSG or the like.

Step 6: As shown in FIGS. 3A through 3C, TG holding trenches 45 are defined in the first interlayer insulating film 44 by photolithography and dry etching (see layouts of FIGS. 15A through 15C).

Figures 4A, 4B, 4C:
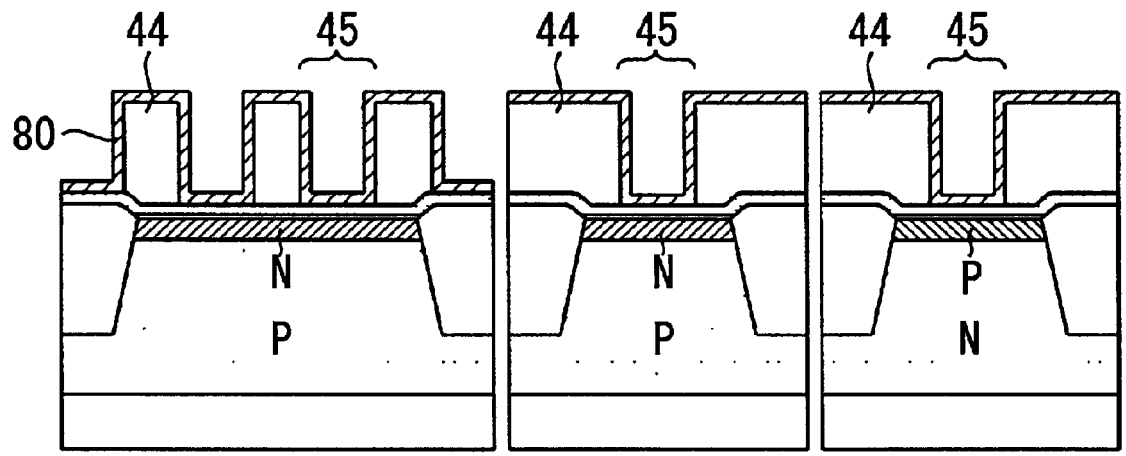

Step 7: As shown in FIGS. 4A through 4C, a spacer nitride film 80 is formed over the silicon nitride film 32 and the first interlayer insulating film 44.

Figures 5A, 5B, 5C:
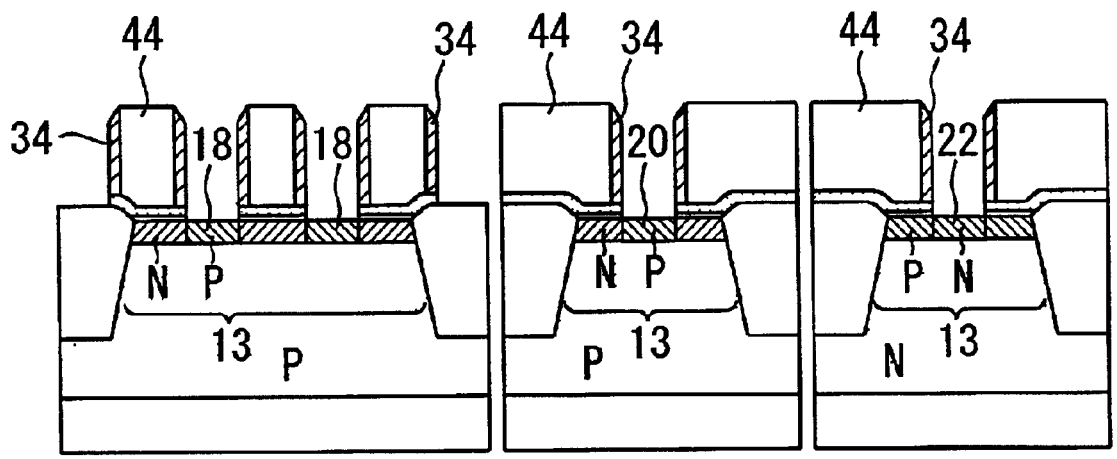

Step 8: As shown in FIGS. 5A through 5C, the spacer nitride film 80 is removed by dry etching until the upper surface of the first interlayer insulating film 44 and the surface of each active region 13 are exposed. As a result, side walls 34 for covering the sides of each first interlayer insulating film 44 are formed.

Step 9: In order to form channels 18, 20 and 22 of transistors in the memory cell section, NMOS transistor section and PMOS transistor section in a self-aligned manner, impurities are introduced into those regions, respectively.

Figures 6A, 6B, 6C:
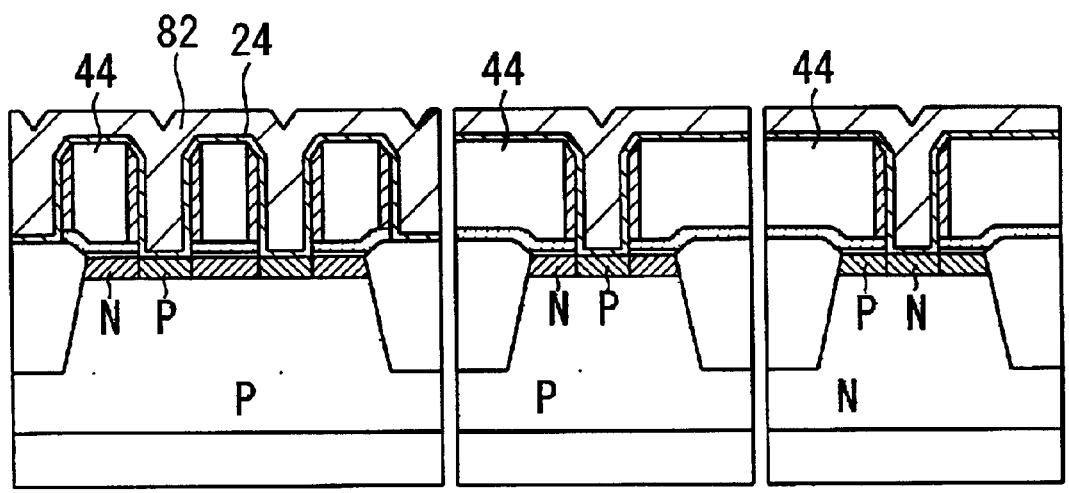

Step 10: As shown in FIGS. 6A through 6C, a gate insulating film 24 and a polysilicon film 82 are formed on the whole surface of the semiconductor wafer by a CVD method. The gate insulating film 24 is formed of, for example, $SiO_2$, $SiON$, $Si_3N_4$, $Ta_2O_5$, $SrTiO$, $BaSrTiO$, $ZrO_2$, $Al_2O_3$, $HFO_2$, $Y_2O_3$ or a laminated film comprising these materials or the like.

Step 10-1: An N-type impurity (P, As or the like) is introduced into the memory cell section and the NMOS transistor section by using a mask.

Step 10-2: A P-type impurity (B, $BF_2$) is introduced into the PMOS transistor section by using a mask.

Step 10-3: Predetermined heat treatment is performed to activate the impurity introduced into the polysilicon film 82 through the above processing. As a result, the polysilicon film 82 is formed as an N-type semiconductor in each of the memory cell section and the NMOS transistor section, whereas the polysilicon film 82 is formed as a P-type semiconductor in the PMOS transistor section.

Figures 7A, 7B, 7C:
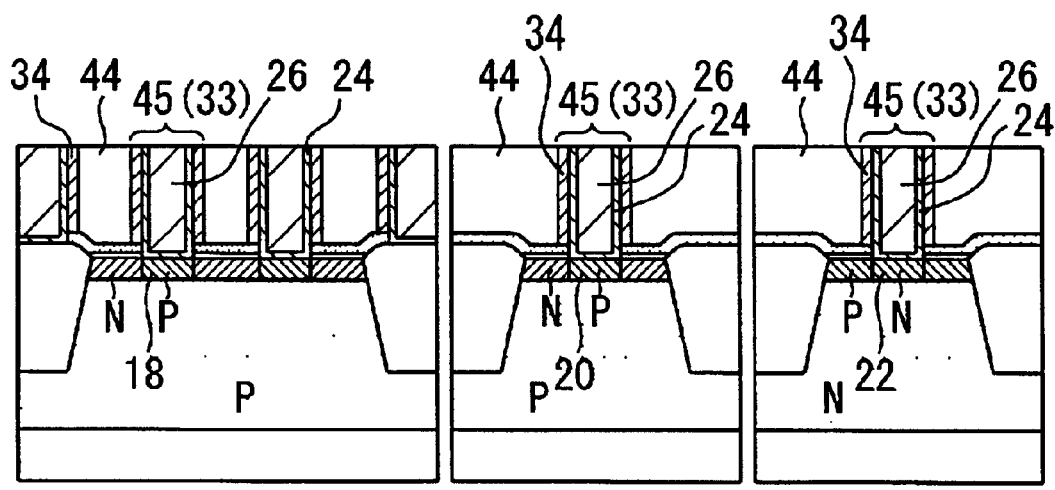

Step 11: As shown in FIGS. 7A through 7C, the whole surface of the semiconductor wafer is polished by CMP (Chemical Mechanical Polishing) until the side walls 34 are exposed. As a result, separate gate electrode films 26 are formed over the channels 18, 20 and 22 in a self-aligned manner, and separate TG 33 are formed in each individual TG holding trenches 45.

Figures 8A, 8B, 8C:
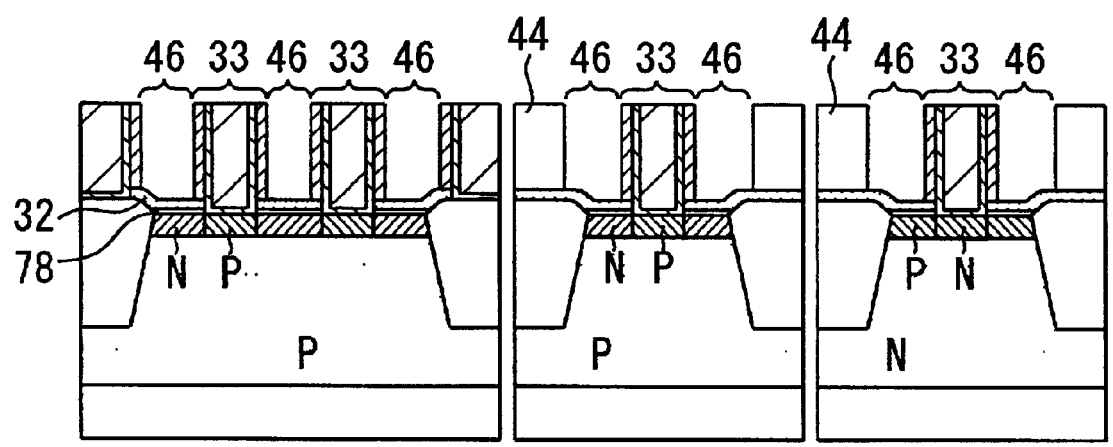

Step 12: The first interlayer insulating films 44 are dry-etched by using mask patterns designated at numerals 84 in FIGS. 16A through 16C. The dry etching is carried out under a condition that the silicon oxide film can be removed at a high selection ratio with respect to the polysilicon and silicon nitride film. As a result, as shown in FIGS. 8A through 8C, contact holes 46 are defined between the adjacent TG 33 (memory cell section) or on both sides of the TG 33 (logic circuit section) in a self-aligned manner (see layouts shown in FIGS. 16A through 16C).

Figures 16A, 16B, 16C:
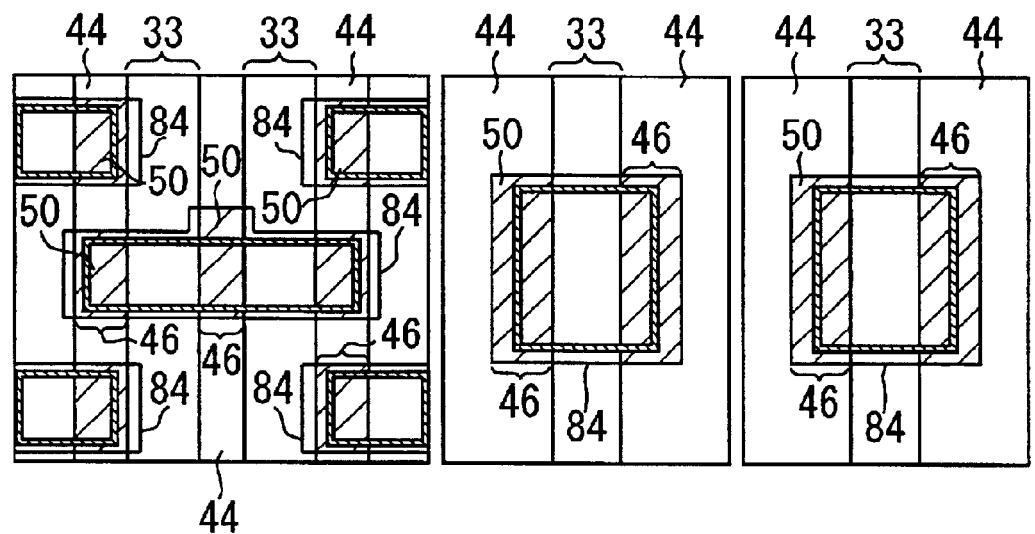
Figures 17A, 17B, 17C:
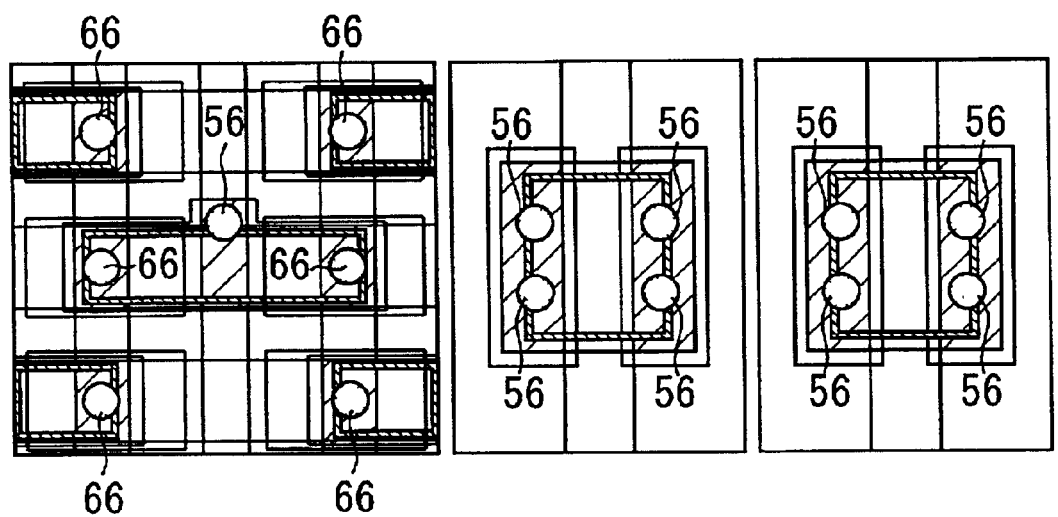

In the present embodiment, large mask patterns 84 extending over a plurality of the contact holes 46 are used for opening the contact holes 46 as shown in FIGS. 16A through 16C. Since an etching condition under which the silicon oxide film can selectively be removed is used, the contact holes 46 can be defined in both the memory cell section and the logic circuit section at their corresponding proper positions in a self-aligned manner regardless of the use of such mask patterns 84.

When the mask patterns 84 sufficiently larger than each individual contact holes 46 are used for opening the contact holes 46 in a self-aligned manner, a larger process margin can be ensured as compared with mask patterns 48 (see FIGS. 29A through 29C) substantially identical to each individual contact holes 46 in size. Thus, according to the manufacturing method of the present embodiment, the proper contact holes 46 can be defined stabler as compared with the conventional manufacturing method.

In the present embodiment as described above, the contact holes 46 are defined not only in the memory cell section but also in the logic circuit section at their corresponding proper positions in a self-aligned manner. Therefore, margins for absorbing position displacement of the contact holes 46 can sufficiently be reduced in the logic circuit section in the present embodiment. Thus, the manufacturing method of the present embodiment ensures further miniaturization of the logic circuit section as compared with the case where the positions of the contact holes in the logic circuit section are determined according to an accuracy of photolithography.

Step 13: The silicon oxide film 78 and the silicon nitride film 32, which have remained at the bottom of each contact hole 46, are removed by dry etching as shown in FIGS. 9A through 9C. Next, an N-type impurity (P, As or the like) and a P-type impurity (B, $BF_2$ or the like) are introduced into the NMOS transistor section and the PMOS transistor section. As a result, an N− region 36 and an N+ region 38 are formed in the NMOS transistor section, whereas a P− region 40 and a P+ region 42 are formed in the PMOS transistor section.

Step 14: As shown in FIGS. 10A through 10B, a polysilicon film 86 is deposited on the whole surface of the semiconductor wafer.

Step 15: The N-type impurity (P, As or the like) is introduced into each of the memory cell section and the NMOS transistor section by using a mask.

Step 16: The P-type impurity (B, $BF_2$ or the like) is introduced into the PMOS transistor section by using a mask.

Step 17: Predetermined heat treatment is carried out to activate the impurity introduced into the polysilicon film 86 following the above processing. As a result, the polysilicon film 86 is formed as an N-type semiconductor in each of the memory cell section and the NMOS transistor section, whereas the polysilicon film 86 is formed as a P-type semiconductor in the PMOS transistor section.

Figures 11A, 11B, 11C:
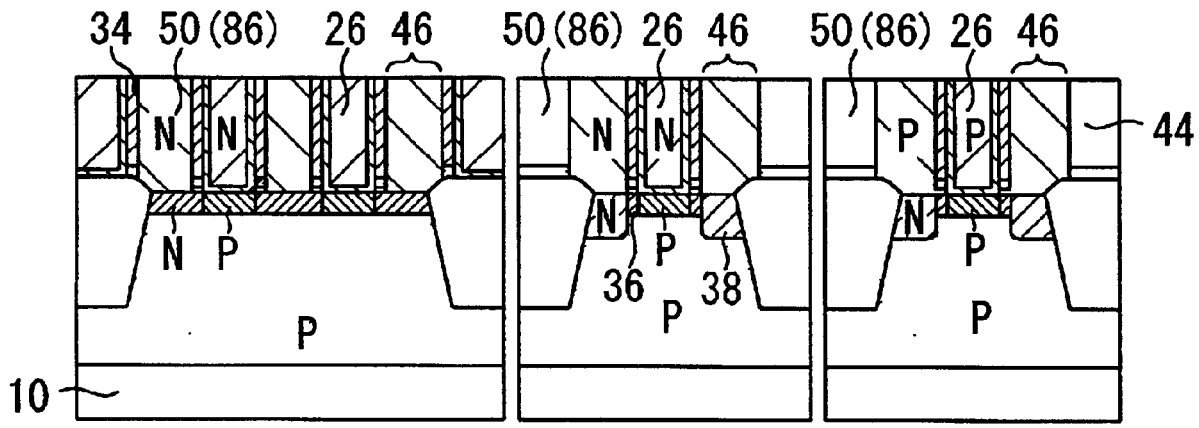

Step 18: As shown in FIGS. 11A through 11C, the whole surface of the semiconductor wafer is polished until the side walls 34 are exposed. As a result, separate contact plugs 50 are respectively formed inside the contact holes 46 (see layouts shown in FIGS. 16A through 16C).

According to the manufacturing method of the present embodiment as described above, the first interlayer insulating film 44 is first formed over the silicon substrate 10 (steps 1 through 5), and each TG 33 can be formed so as to be embedded in the first interlayer insulating film 44 (steps 6 through 11). Further, according to the manufacturing method of the present embodiment, the contact plugs 50 can be formed so as to be embedded in the first interlayer insulating film 44 after the formation of the TG 33.

Namely, the manufacturing method of the present embodiment does not have the necessity of depositing the silicon oxide film between the adjacent TG 33 in the process of forming the TG 33 and the contact plugs 50. In this case, the manufacturing method can handle the scale-down of the embedded DRAM device, i.e., an increase in the aspect ratio (corresponding to the ratio of the height of the TG 33 to the width thereof) of the TG 33 without deteriorating the quality of the first interlayer insulating film 44. Thus, according to the manufacturing method of the present embodiment, the embedded DRAM device can stably be manufactured as compared with the case where the method of depositing the silicon oxide film between the adjacent TG 33 is adopted after the formation of the TG 33.

Step 19: After the formation of the contact plugs 50, a Co film 88 is formed over the entire surface of the semiconductor wafer.

Step 20: Predetermined heat treatment is effected on the semiconductor wafer to allow each silicon's exposed portion and the Co film 88 to react with each other. As a result, a silicide film of Co and Si, i.e., a salicide film 90 such as $CoSi_2$ or the like is formed only on the exposed portion of the silicon in a self-aligned manner.

Figures 12A, 12B, 12C:
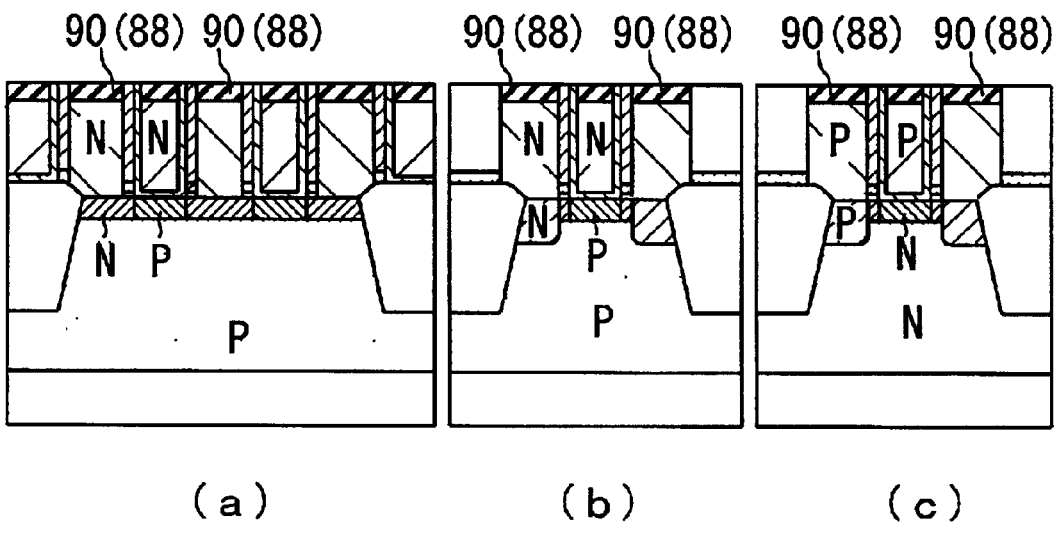

Step 21: After the formation of the salicide film 90, each unreacted Co film 88, which remains on the semiconductor wafer, is removed. As a result, states shown in FIGS. 12A through 12C are formed.

Figures 13A, 13B, 13C:
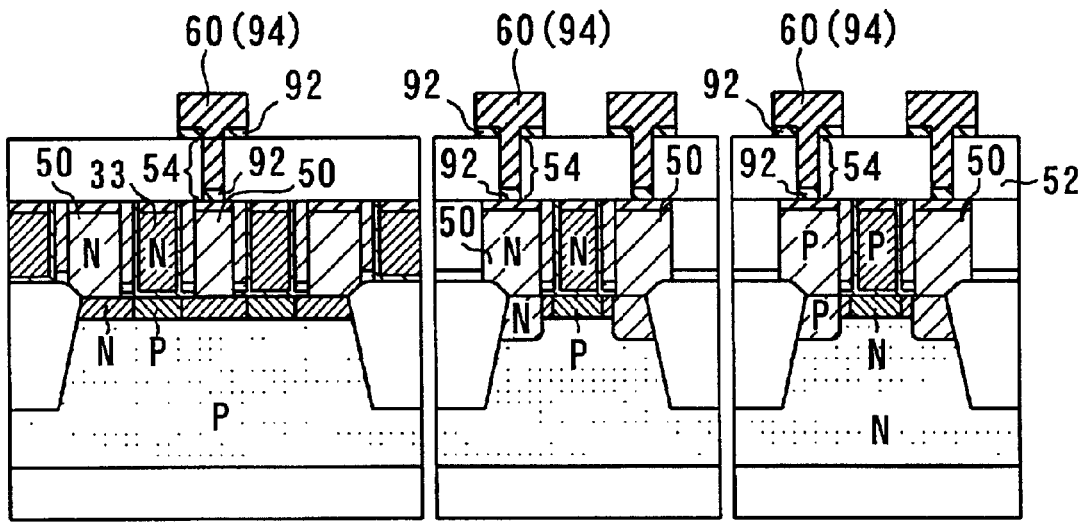

Step 22: As shown in FIGS. 13A through 13C, a second interlayer insulating film 52 is deposited on the whole surface of the semiconductor wafer.

Step 23: BL contacts 54 for conducting the contact plugs 50 and bit lines are formed in the memory cell section, the NMOS transistor section and the PMOS transistor section. The BL contacts 54 are formed by using mask patterns (corresponding to diameter-reduced mask patterns smaller than the contact plugs 50) designated at numerals 56 in FIGS. 17A through 17C.

Step 24: A barrier metal 92 (TiN, Ti, WN or the like) is formed at the bottom of each BL contact 54 and on the surface of the second interlayer insulating film 52. Next, a metal film (W, Al, AlCu or the like) is deposited on the barrier metal 92 by a CVD method or sputtering method.

Step 25: The metal film 94 and the barrier metal 92 are patterned to desired shapes over the second interlayer insulating film 52 to thereby form bit lines 60.

Figures 14A, 14B, 14C:
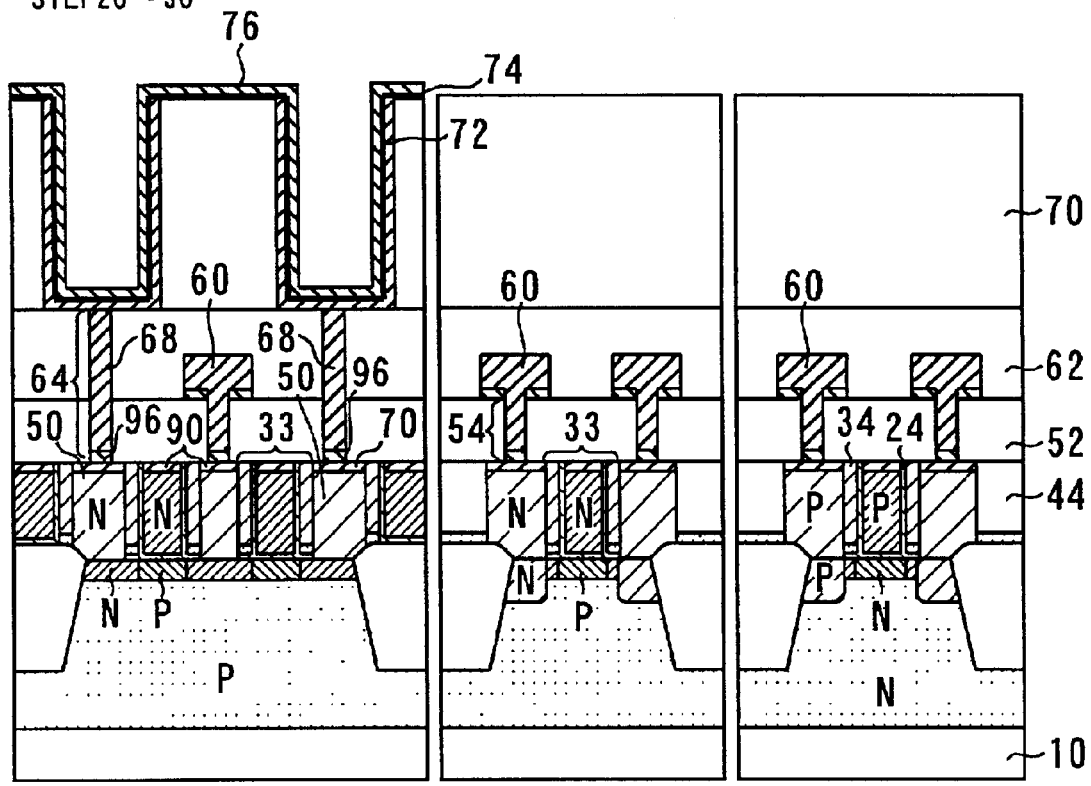
Figures 15A, 15B, 15C:
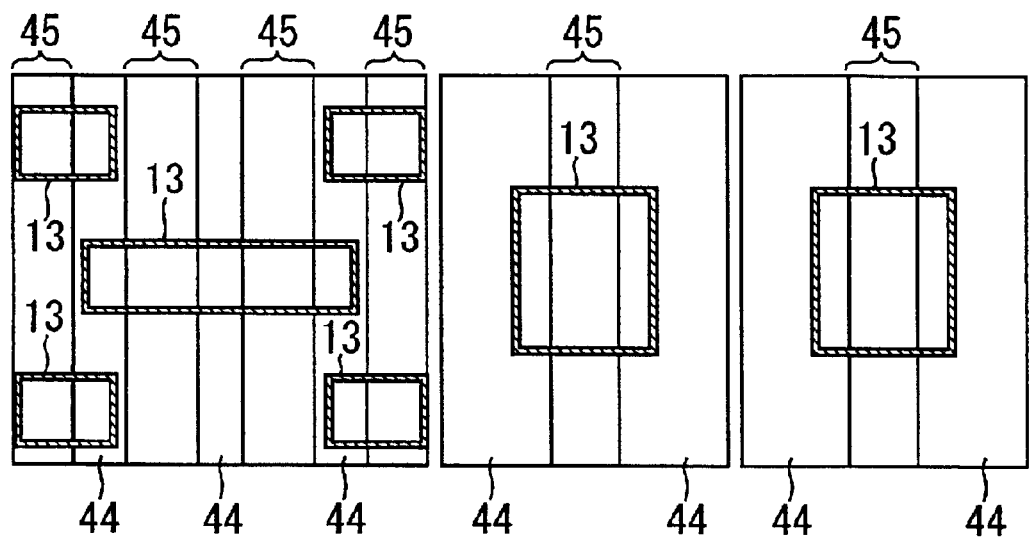

Step 26: A third interlayer insulating film 62 is formed over the bit lines 60 as shown in FIGS. 14A through 14C.

Step 27: Capacitor contacts 64, which extend through the second and third interlayer insulating films 52 and 62 and are open above the contact plugs 50, are formed in the memory cell section. The capacitor contacts 64 are formed by using mask patterns (corresponding to diameter-reduced mask patterns smaller than the contact plugs 50) designated at numerals 66 in FIGS. 17A through 17C.

Step 28: A barrier metal 96 (TiN, Ti, WN or the like) is deposited on the whole surface of the semiconductor wafer. Next, a metal film 68 such as W, Al or the like is deposited over the entire surface of the semiconductor wafer by the CVD method or sputtering method.

Step 29: The barrier metal 96 and the metal film 68 deposited on the surface of the third interlayer insulating film 62 are removed by a CMP method or the like. As a result, the barrier metals 96 and conductive contact plugs 68 are embedded in the capacitor contacts 64.

Step 30: A fourth interlayer insulating film 70 is formed on the third interlayer insulating film 62. A capacitor lower electrode 72 conducted into the contact plugs 68, a high-dielectric capacitor insulating film 74 covering the lower electrode 72, and a capacitor upper electrode 76 for covering the insulating film 74 are formed in the memory cell section. Incidentally, the lower electrode 72 and the upper electrode 76 are respectively formed of W, Ti, TiN, Ru, $RuO_2$, Ir, $IrO_2$ or the like. Further, the capacitor insulating film 74 is formed of $Ta_2O_5$, SrTiO, BaSrTiO or the like. In the manufacturing method of the present embodiment, an embedded memory device equipped with a DRAM having a COB structure is manufactured by executing the above-described series of processes.

Second Embodiment

Figures 18A, 18B, 18C:
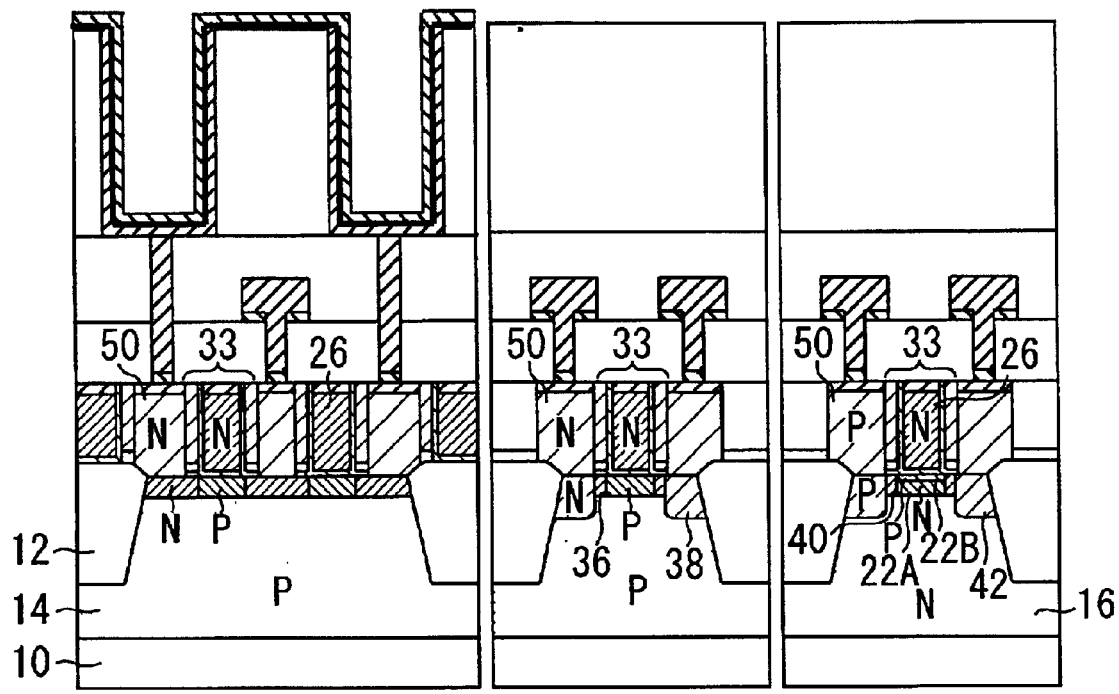
FIGS. 18A through 18C are sectional views for describing a method of manufacturing a semiconductor device according to a second embodiment of the present invention.

A method of manufacturing a semiconductor device according to a second embodiment of the present invention will next be described with reference to FIGS. 18A through 18C. The manufacturing method of the present embodiment is similar to that of the first embodiment except for the processes of steps 9 through 10-3. In step 9 of the first embodiment (see FIGS. 5A through 5C), the N-type impurity is introduced into the PMOS transistor section to form the channel 22 of PMOS.

In step 9 of the present embodiment, an N-type impurity (P, As or the like) is first introduced into the PMOS transistor section at a depth of 30–100 nm, then a P-type impurity (B, BF$_2$ or the like) is introduced at a depth of 5–50 nm. As a result, a buried channel 22A of an N-type semiconductor and a counter channel 22B of a P-type semiconductor are formed below a TG 33 of the PMOS transistor section. Namely, a buried channel PMOS is formed in the PMOS transistor section in the manufacturing method of the present embodiment.

In step 10 of the first embodiment, a polysilicon film 82 containing no impurity is first deposited on the whole surface of a semiconductor wafer (see FIGS. 6A through 6C). Then, the polysilicon film 82 of each of the memory cell section and NMOS transistor section is formed as an N-type semiconductor, whereas the polysilicon film 82 of the PMOS transistor section is formed as a P-type semiconductor through steps 10-1 through 10-3.

In the present embodiment, the buried channel PMOS is formed in the PMOS transistor section as mentioned previously. In this case, each gate electrode 26 in the PMOS transistor section can be formed as the N-type semiconductor. Therefore, the manufacturing method of the present embodiment can omit steps 10-1 through 10-3 employed in the first embodiment under the condition that doped polysilicon containing the N-type impurity (P, As or the like) is deposited on the whole surface of the semiconductor wafer to form the polysilicon film 82 in step 10. Therefore, according to the manufacturing method of the present embodiment, a miniaturized embedded DRAM device can be manufactured simpler as compared with the first embodiment.

Third Embodiment

Figures 19A, 19B, 19C:
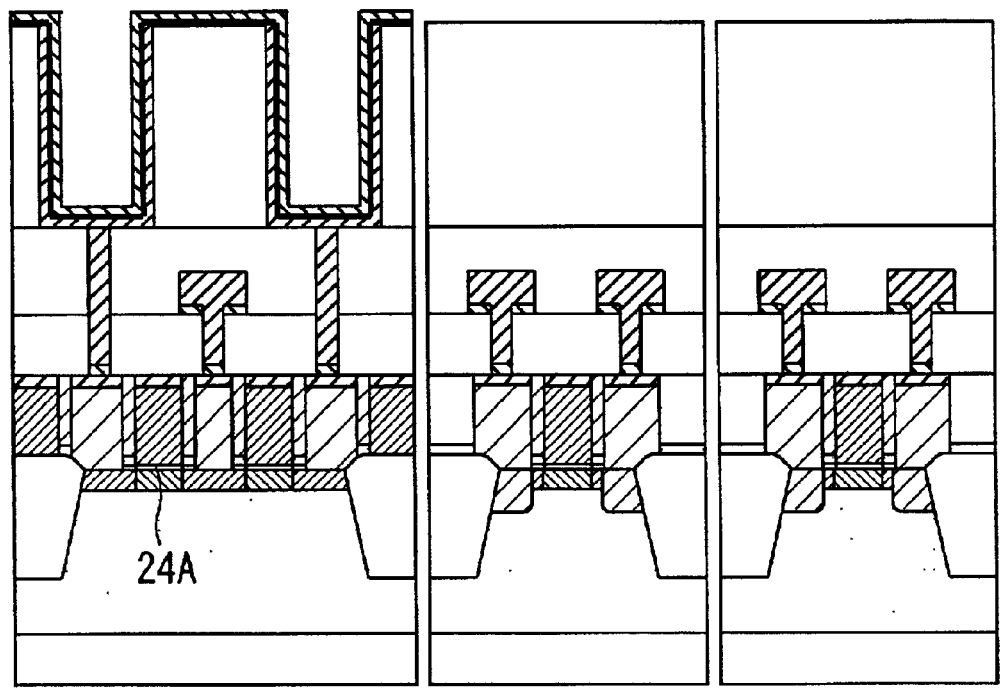
FIGS. 19A through 19C are sectional views for describing a method of manufacturing a semiconductor device according to a third embodiment of the present invention.

A method of manufacturing a semiconductor device according to a third embodiment of the present invention will next be described with reference to FIGS. 19A through 19C. The manufacturing method of the present embodiment is similar to that of the first embodiment except for the process of step 10. In the first embodiment, the gate insulating film 24 is formed by the CVD method in step 10 (see FIGS. 6A through 6C). In the present embodiment on the other hand, a gate insulating film 24A is formed by a thermal oxidation method or thermal oxidation nitriding method in step 10. In a manner similar to the manufacturing method of the first embodiment, a miniaturized embedded DRAM device can stably be manufactured even by the manufacturing method of the present embodiment.

Fourth Embodiment

Figures 20A, 20B, 20C:
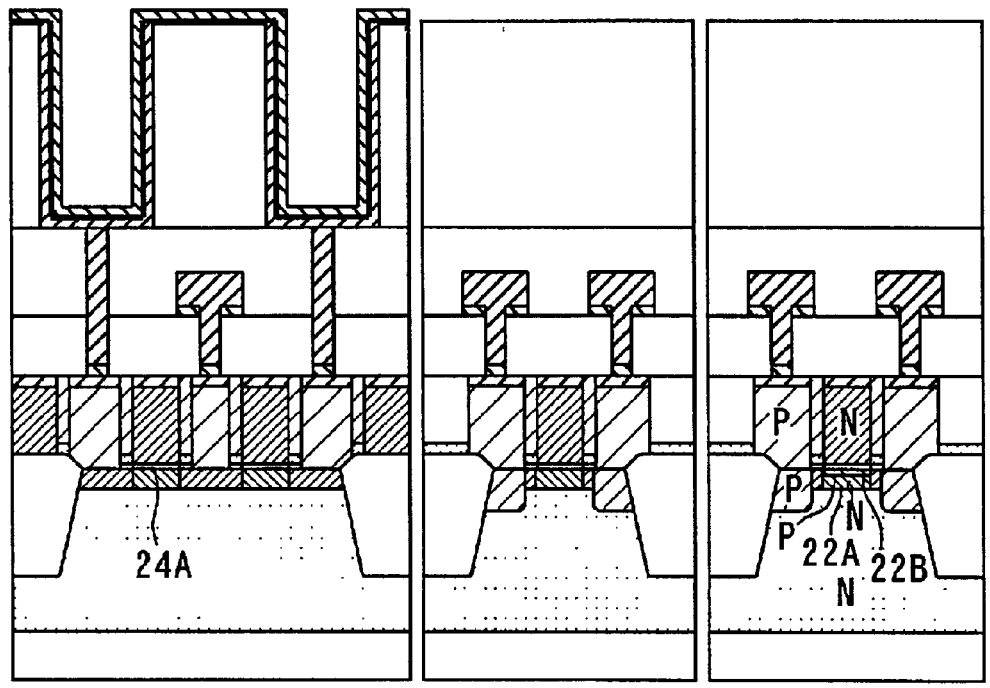
FIGS. 20A through 20C are sectional views for describing a method of manufacturing a semiconductor device according to a fourth embodiment of the present invention.

A method of manufacturing a semiconductor device according to a fourth embodiment of the present invention will next be explained with reference to FIGS. 20A through 20C. The manufacturing method of the present embodiment is a combination of the manufacturing method of the second embodiment and the manufacturing method of the third embodiment. Namely, in the manufacturing method of the present embodiment, a buried channel 22A and a counter channel 22B are formed in a PMOS transistor region. Further, a gate insulating film 24A is formed by a thermal oxidation method or thermal oxidation nitriding method. In a manner similar to the manufacturing method of the first embodiment, a micro embedded DRAM device can stably be manufactured even by the manufacturing method of the present embodiment.

Fifth Embodiment

Figures 21A, 21B, 21C:
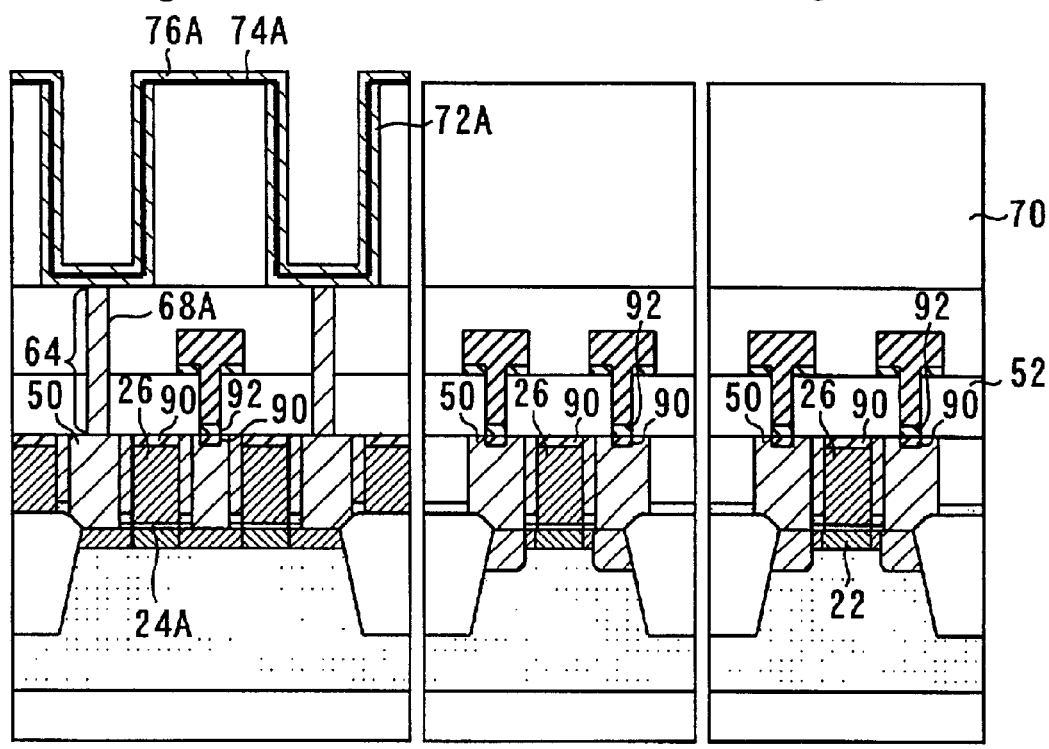
FIGS. 21A through 21C are sectional views for describing a method of manufacturing a semiconductor device according to a fifth embodiment of the present invention.

A method of manufacturing a semiconductor device according to a fifth embodiment of the present invention will next be described with reference to FIGS. 21A through 21C. The manufacturing method of the present embodiment is a modification of the manufacturing method of the third embodiment. Namely, the following processes are executed following the process of step 11 (see FIGS. 7A through 7C).

Step 11-1: A Co film is formed on the whole surface of a semiconductor wafer by a sputtering method.

Step 11-2: Predetermined heat treatment is effected on the semiconductor wafer to form a salicide film 90 of Co and Si on each exposed portion of silicon in a self-aligned manner.

Step 11-3: Each unreacted Co film, which remains on the semiconductor wafer, is removed by wet etching.

Steps 12 through 18 are subsequently executed. In this case, the surface of each gate electrode film 26 is covered with the salicide film 90 after completion of step 18 (see FIGS. 11A through 11C). In the present embodiment, processes of steps 19 through 21 (see FIGS. 12A through 12C) are omitted.

In the manufacturing method of the present embodiment, BL contacts 54 are formed in step 23 (see FIGS. 13A through 13C). Thereafter, the following processes are executed.

Step 23-1: A Co film is formed on the whole surface of the semiconductor wafer by the sputtering method.

Step 23-2: Predetermined heat treatment is effected on the semiconductor wafer to form a salicide film 90 at each exposed portion of silicon alone, i.e., at the bottom of each BL contact 54.

Step 23-3: Each unreacted Co film, which remains on a second interlayer insulating film 52, is removed by wet etching.

Processes of steps 24 through 27 are executed following the above process. A process of step 28, i.e., a process for forming a barrier metal 96 at the bottom of each capacitor contact 64 is omitted. A process of step 29, i.e., a process for forming each contact plug 68 by W or Al is replaced by the following process.

Step 29-1: A contact plug 68A is formed inside each capacitor contact 64 by using polysilicon.

Further, a process of step 30 for forming each capacitor in a memory cell section is replaced by the following processes in the present embodiment.

Step 30-1: Capacitor holding spaces are provided in a fourth interlayer insulating film 70, and capacitor lower electrodes 72A are formed therein by doped polysilicon containing an N-type impurity.

Step 30-2: A capacitor insulating film 74A is formed of an SiON film or the like so as to cover the lower electrodes 72A.

Step 30-3: A capacitor upper electrode 76A is formed on the capacitor insulating film 74A by the doped polysilicon containing the N-type impurity.

In the present embodiment, the process for forming the barrier metal 96 at the bottom of each capacitor contact 64 can be omitted as described above. Therefore, according to the manufacturing method of the present embodiment, a miniaturized embedded DRAM device can be manufactured simpler as compared with the third embodiment.

Sixth embodiment

A method of manufacturing a semiconductor device according to a sixth embodiment of the present invention will next be described with reference to FIGS. 22A through 22C. The manufacturing method of the present embodiment is a combination of the manufacturing method of the fourth embodiment and the manufacturing method of the fifth embodiment. Namely, in the present embodiment, a buried channel 22A and a counter channel 22B are formed in a PMOS transistor region, and a gate insulating film 24A is formed by a thermal oxidation method or thermal oxidation nitriding method. Further, in the present embodiment, contact plugs 68A formed of polysilicon, which are brought into direct contact with their corresponding contact plugs 50, are formed inside capacitor contacts 64. An effect similar to that obtained by the first embodiment can be obtained even by the manufacturing method of the present embodiment.

Seventh Embodiment

A method of manufacturing a semiconductor device according to a seventh embodiment of the present invention will next be explained with reference to FIGS. 23A through 23C. The manufacturing method of the present embodiment is a combination of the manufacturing method of the first embodiment and the manufacturing method of the fifth embodiment. An effect similar to that obtained by the first embodiment can be obtained even by the manufacturing method of the present embodiment.

Eighth Embodiment

Figures 24A, 24B, 24C:
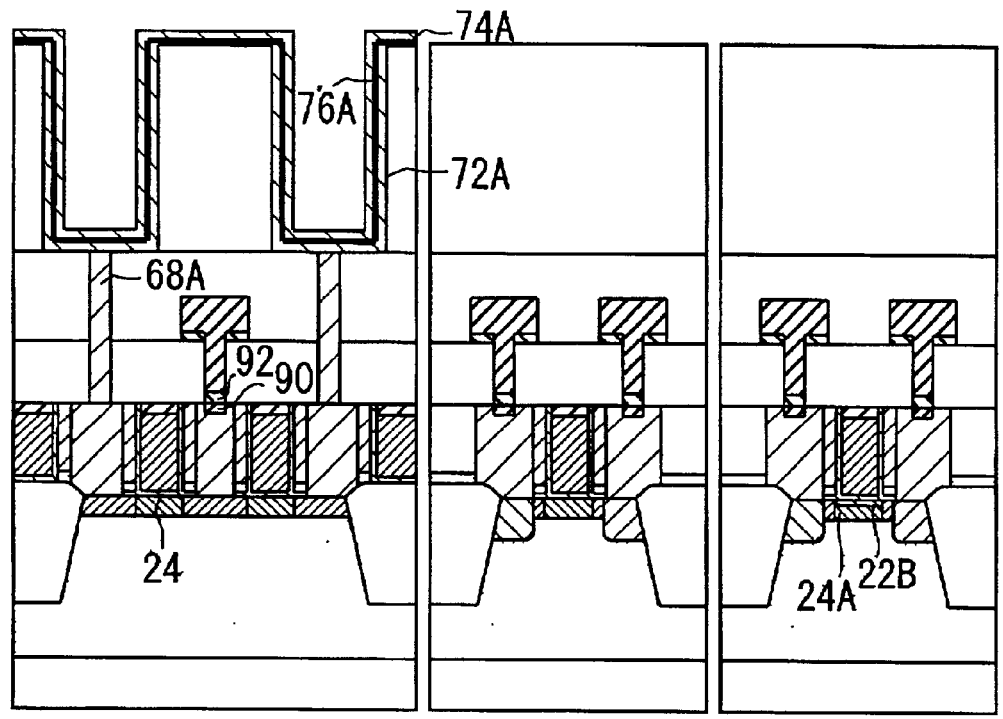
FIGS. 24A through 24C are sectional views for describing a method of manufacturing a semiconductor device according to an eighth embodiment of the present invention.

A method of manufacturing a semiconductor device according to an eighth embodiment of the present invention will next be explained with reference to FIGS. 24A through 24C. The manufacturing method of the present embodiment is a combination of the manufacturing method of the second embodiment and the manufacturing method of the fifth embodiment. An effect similar to that obtained by the second embodiment can be obtained even by the manufacturing method of the present embodiment.

Ninth Embodiment

Figures 25A, 25B, 25C:
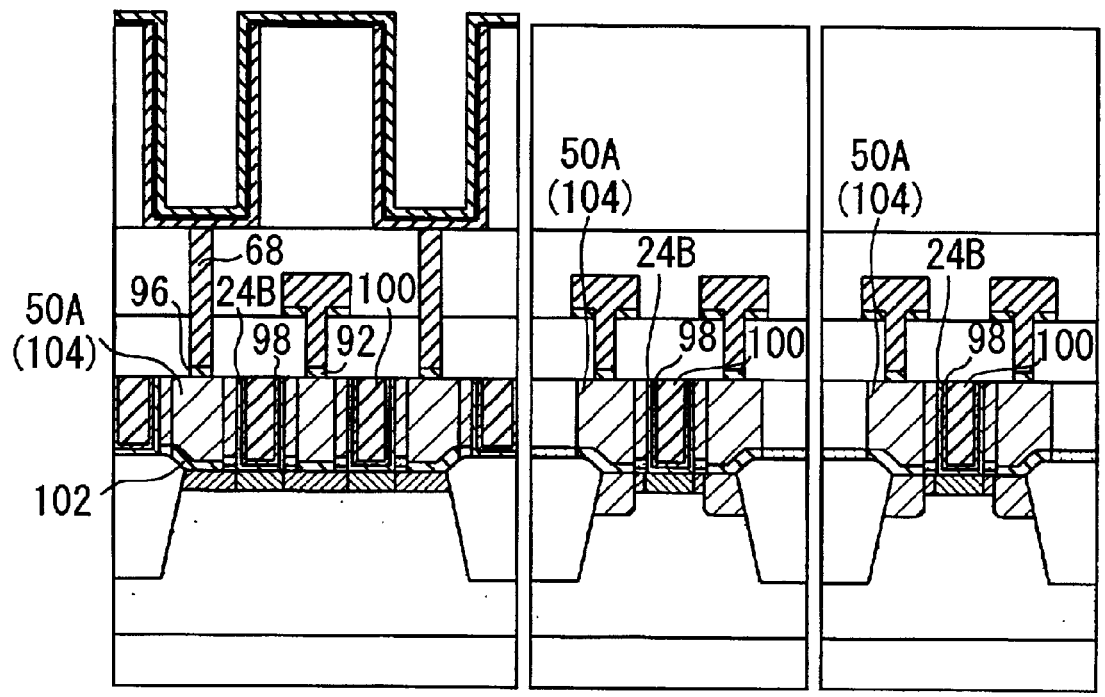
FIGS. 25A through 25C are sectional views for describing a method of manufacturing a semiconductor device according to a ninth embodiment of the present invention.

A method of manufacturing a semiconductor device according to a ninth embodiment of the present invention will next be explained with reference to FIGS. 25A through 25C. The manufacturing method of the present embodiment is a modification of the manufacturing method of the first embodiment. Namely, in the present embodiment, the following processes are executed in place of the process (see FIGS. 6A through 6C) of step 10 employed in the first embodiment.

Step 10-4: A high-dielectric gate insulating film 24B ($Ta_2O_5$, SrTiO, BaSrTiO or the like) is formed on the whole surface of a semiconductor wafer by a CVD method.

Step 10-5: A barrier metal 98 (Ti, TiN, WN, Ru, $RuO_2$, Ir, $IrO_2$ or the like) is formed over the high-dielectric gate insulating film 24B.

Step 10-6: A metal gate electrode film 100 (W, Al, AlCu, Cu or the like) is formed over the barrier metal 98.

In the present embodiment, the following processes are executed following step 13 (see FIGS. 9A through 9C) employed in the first embodiment as an alternative to steps 14 through Step 13-1: A barrier metal 102 (Ti, TiN or the like) and a metal material 104 (W, Al or the like) used for each contact plug are deposited on the whole surface of the semiconductor wafer.

Step 13-2: Unnecessary portions are removed by CMP to form metal contact plugs 50A.

When each of the contact plugs 50A is formed of the metal material, it is not necessary to form a silicide film or the like on the surface thereof. Therefore, the processes of steps 19 through 21 employed in the first embodiment can be omitted in the present embodiment. Thus, according to the manufacturing method of the present embodiment, a miniaturized embedded DRAM device can be formed simpler as compared with the first embodiment.

Tenth Embodiment

Figures 26A, 26B, 26C:
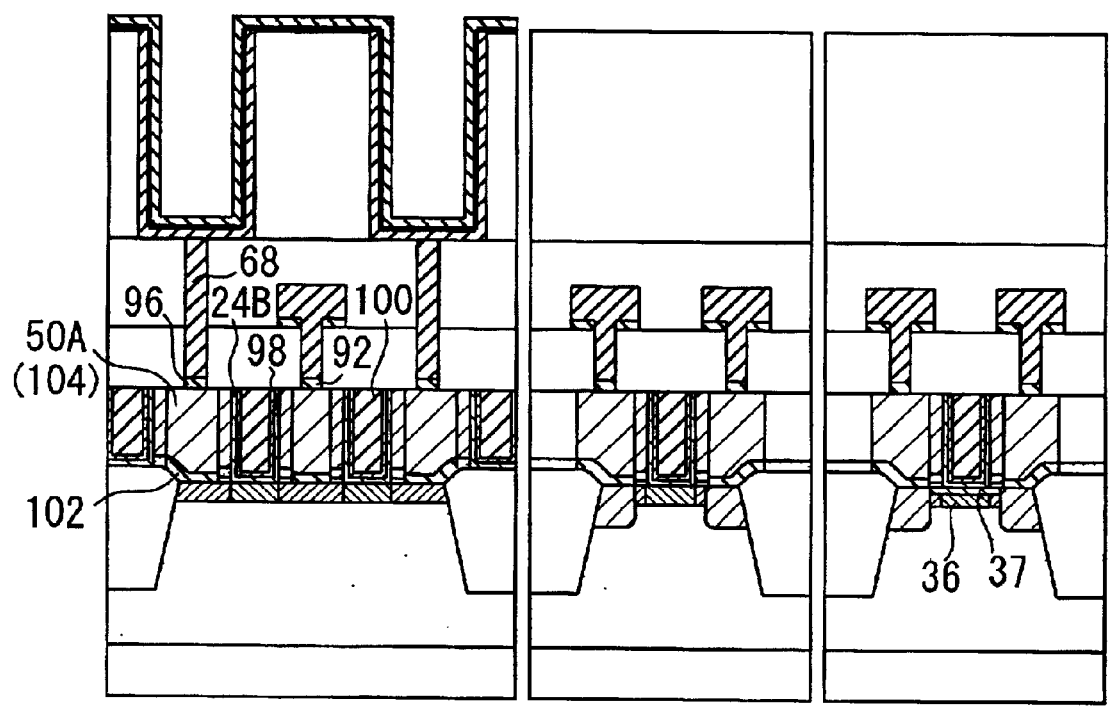
FIGS. 26A through 26C are sectional views for describing a method of manufacturing a semiconductor device according to a tenth embodiment of the present invention.
Figure 30A:
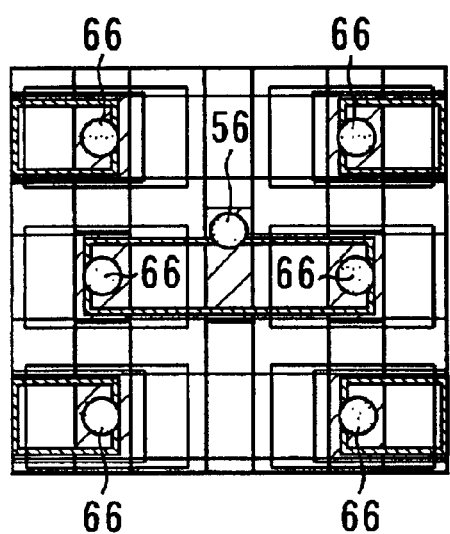
Figure 30B:
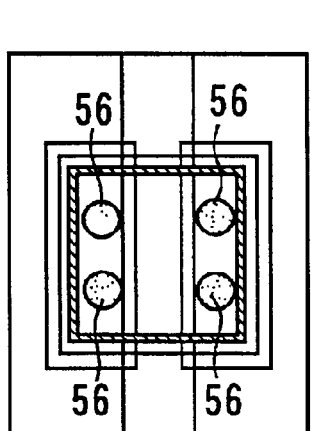
Figure 30C:
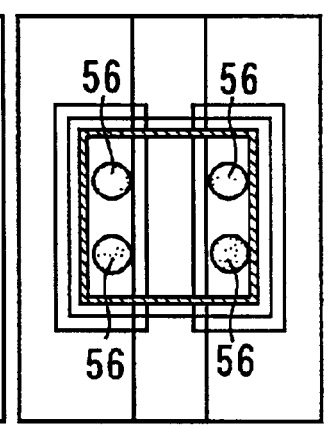

A method of manufacturing a semiconductor device according to a tenth embodiment of the present invention will next be explained with reference to FIGS. 26A through 26C. The manufacturing method of the present embodiment is a combination of the manufacturing method of the second embodiment and the manufacturing method of the ninth embodiment. An effect similar to that obtained by the second embodiment can be obtained even by the manufacturing method of the present embodiment.

In the aforementioned ninth and tenth embodiments, the metal material is embedded in each of the trenches formed on the semiconductor wafer, and the surface thereof is flattened by the method such as CMP, whereby the metal contact plugs 50A and the metal gate electrode films 100 are formed. The process of patterning the metal material with satisfactory accuracy by etching with the resist or oxide film as the mask is accompanied by technically high degree of difficulty. On the other hand, the method according to the ninth or tenth embodiment can form those with ease. Thus, the method according to the ninth or tenth embodiment can bring about even an effect that the metal electrodes or the like can easily be formed.

Since the present invention is constructed as described above, the following effects are brought about.

According to a first aspect of the present invention, diameter-reduced contact plugs are formed on their corresponding contact plugs formed in a self-aligned manner. Thus, contact plugs each having a sufficiently large depth can stably be formed. Since it is not necessary to form an interlayer insulating film such that spaces between adjacent transfer gates are buried, the present invention can cope with a high level of miniaturization of a semiconductor device.

According to a second aspect of the present invention, an effect similar to that obtained by the first aspect of the present invention can be obtained in a memory cell section having a bit line and capacitors.

According to a third aspect of the present invention, an effect similar to that obtained by the first aspect of the present invention can be ensured, even if all of the contact plugs, diameter-reduced contact plugs, and capacitor lower electrodes are implemented by doped silicon.

According to a fourth aspect of the present invention, an effect similar to that obtained by the first aspect of the present invention can be brought about, with capacitor lower electrodes and capacitor upper electrodes both formed of doped silicon and a capacitor insulating film formed of SiON.

According to a fifth aspect of the present invention, an effect similar to that obtained by the first aspect of the present invention can be obtained in a logic circuit section having bit lines.

According to a sixth aspect of the present invention, an effect similar to that obtained by the first aspect of the present invention can be obtained in a logic circuit section having a CMOS transistor.

According to a seventh aspect of the present invention, a CMOS transistor and a wiring structure for operating the CMOS transistor can efficiently be formed in a logic circuit section.

According to a eighth aspect of the present invention, one of an NMOS transistor and a PMOS transistor, which constitute a CMOS transistor, is formed as a buried channel MOS transistor. Therefore, according to the present invention, a wiring structure for activating the CMOS transistor can be implemented with ease.

According to a ninth aspect of the present invention, an effect similar to that obtained by the first aspect of the present invention can be obtained in a structure wherein contact plugs and a gate electrode layer are formed of doped silicon, and diameter-reduced contact plugs are formed of a metal.

According to a tenth aspect of the present invention, an effect similar to that obtained by the first aspect of the present invention can be obtained, even if gate electrodes are formed of a metal material.

According to a eleventh aspect of the present invention, a gate insulating film can suitably be formed on a surface of a silicon substrate, which is exposed between side walls, by a CVD method, a thermal oxidation method or thermal oxidation nitriding method in a process for forming a memory cell section.

According to a twelfth aspect of the present invention, contact holes can properly be formed in a self-aligned manner by using mask patterns having openings sufficiently larger than the contact holes to be formed. Process margin relating to formation of a contact hole becomes easier to be ensured as the mask pattern increases. Thus, according to the present invention, the process of defining the contact holes can be facilitated.

Further, the present invention is not limited to these embodiments, but variations and modifications may be made without departing from the scope of the present invention.

The entire disclosure of Japanese Patent Application No. 2000-220609 filed on Jul. 21, 2000 including specification, claims, drawings and summary are incorporated herein by reference in its entirety.

What is claimed is:

1. A semiconductor device, comprising:
   conductive transfer gates comprising conductive parts;
   contact plugs adjacent to said conductive transfer gates, each contact plug and each conductive transfer gate having a respective upper surface, wherein the upper surfaces of the contact plugs and the upper surfaces of the conductive transfer gates are substantially coplanar;
   said each conductive transfer gate having a gate insulating film, a gate electrode layer, and side walls for covering sides of said gate insulating film and said gate electrode layer;
   said contact plugs adjacent to said gate electrode layer, said side wall interposed therebetween:
   a first interlayer insulating film having a surface which defines the same surface as the upper surfaces of said conductive transfer gates and said contact plugs;
   a second interlayer insulating film Formed on said first interlayer insulating film; and
   diameter-reduced contact plugs which are smaller than said contact plugs and extend through said second interlayer insulating film to conduct to said contact plugs, respectively.

2. The semiconductor device according to claim 1, further including a memory cell section having a plurality of memory cells,
   said memory cell section including, in addition to said conductive transfer gates, said contact plugs, and said first and second interlayer insulating films,
   a bit line formed on said second interlayer insulating film;
   a third interlayer insulating film formed on said second interlayer insulating film so as to cover said bit line; and
   capacitors formed on said third interlayer insulating film;
   said memory cell section further including said diameter-reduced contact plugs, which include
   a bit line contact plug which extends through said second interlayer insulating film to bring said contact plugs and said bit line into conduction; and
   capacitor contact plugs which extend through said second and third interlayer insulating films to bring said contact plugs and said capacitors into conduction.

3. The semiconductor device according to claim 2, further including a logic circuit section including a plurality of transistors, said logic section including, in addition to said transfer gates, said contact plugs, and said first and second interlayer insulating films,
   bit lines formed on said second interlayer insulating film; and
   said logic circuit section further including, as said diameter-reduced contact plugs,
   bit line contact plugs which extend through said second interlayer insulating film to bring said contact plugs and said bit lines into conduction.

4. The semiconductor device according to claim 3, wherein said logic circuit section has NMOS transistors and PMOS transistors both of which constitute CMOS transistors.

5. The semiconductor device according to claim 4, wherein contact plugs and gate electrode layers provided in association with said NMOS transistors respectively have a doped silicon layer containing an N-type impurity, and
   contact plugs and gate electrode layers provided in association with said PMOS transistors respectively have a doped silicon layer containing a P-type impurity.

6. The semiconductor device according to claim 4, wherein said memory cell section has transistors each having a first-conduction type,
   one of the NMOS transistors and the PMOS transistors having a conduction type different from the first conduction type has a buried channel prepared for the first conduction type semiconductor, and a counter channel formed in a surface region of the buried channel by a semiconductor prepared for a second conduction type,
   said each contact plug provided in association with the NMOS transistor has a doped silicon layer containing an N-type impurity,
   said each contact plug provided in association with the PMOS transistor has a doped silicon layer containing a P-type impurity, and
   any of said gate electrode layers provided in association with the NMOS transistors and said gate electrode layers provided in association with the PMOS transistors has a doped silicon layer containing a first conduction type impurity.

7. The semiconductor device according to claim 1, further including a logic circuit section including a plurality of transistors, said logic section including, in addition to said conductive transfer gates, said contact plugs, and said first and second interlayer insulating films,
   bit lines formed on said second interlayer insulating film; and
   said logic circuit section further including, as said diameter-reduced contact plugs,
   bit line contact plugs which extend through said second interlayer insulating film to bring said contact plugs and said bit lines into conduction.

8. The semiconductor device according to claim 7, wherein said logic circuit section has NMOS transistors and PMOS transistors both of which constitute CMOS transistors.

9. The semiconductor device according to claim 8, wherein contact plugs and gate electrode layers provided in association with said NMOS transistors respectively have a doped silicon layer containing an N-type impurity, and contact plugs and gate electrode layers provided in association with said PMOS transistors respectively have a doped silicon layer containing a P-type impurity.

10. The semiconductor device according to claim 1, wherein the gate electrode layer of said conductive transfer gate has a metal layer and a barrier metal which surrounds the metal layer.

11. The semiconductor device according to claim 1, wherein a gate oxide film of said transfer gate is a CVD insulating film formed by a CVD method.

12. The semiconductor device according to claim 1, wherein the gate insulating film of said conductive transfer gate is a thermal oxide film formed by a thermal oxidation method or a thermally-oxidized nitride film formed by a thermal oxidation nitriding method.

13. A semiconductor device, comprising:

conductive transfer gates comprising conductive parts;

contact plugs adjacent to said conductive transfer gates, each contact plug and each conductive transfer gate having a respective upper surface, wherein the upper surfaces of the contact plugs and the upper surfaces of the conductive parts of the transfer gates are substantially coplanar;

said each conductive transfer gate having a gate insulating film, a gate electrode layer, and side walls for covering sides of said gate insulating film and said gate electrode layer;

a first interlayer insulating film having a surface which defines the same surface as the upper surfaces of said conductive parts of the transfer gates and said contact plugs;

a second interlayer insulating film formed on said first interlayer insulating film;

diameter-reduced contact plugs which are smaller than said contact plugs and extend through said second interlayer insulating film to conduct to said contact plugs, respectively; and a memory cell section having a plurality of memory cells, said memory cell section including, in addition to said conductive transfer gates, said contact plugs, and said first and second interlayer insulating films, a bit line formed on said second interlayer insulating film;

a third interlayer insulating film formed on said second interlayer insulating film so as to cover said bit line; and capacitors formed on said third interlayer insulating film;

said memory cell section further including said diameter-reduced contact plugs, which include a bit line contact plug which extends through said second interlayer insulating film to bring said contact plugs and said bit line into conduction; and capacitor contact plugs which extend through said second and third interlayer insulating films to bring said contact plugs and said capacitors into conduction;

wherein said gate electrode layer has a doped silicon layer containing an impurity and a silicide film for covering a surface of the doped silicon layer, any of said contact plugs corresponding to said capacitors, said capacitor contact plugs, and lower electrodes of said capacitors is formed of doped silicon containing an impurity, said contact plug corresponding to the bit line has a doped silicon layer containing an impurity and a suicide film formed only at a portion brought into contact with said bit line contact plug, and said bit line contact plug has a barrier metal brought into contact with said each contact plug and a metal layer formed on the barrier metal.

14. The semiconductor device according to claim 13, wherein said capacitor includes a capacitor insulating film formed of SiON and an upper electrode comprised of doped silicon containing an impurity.

15. A semiconductor device, comprising:

conductive transfer gates comprising conductive parts;

contact plugs adjacent to said conductive transfer gates, each contact plug and each conductive transfer gate having a respective upper surface, wherein the upper surfaces of the contact plugs and the upper surfaces of the conductive parts of the transfer gates are substantially coplanar;

said each conductive transfer gate having a gate insulating film, a gate electrode layer, and side walls for covering sides of said gate insulating film and said gate electrode layer;

a first interlayer insulating film having a surface which defines the same surface as the upper surfaces of said conductive parts of the transfer gates and said contact plugs;

a second interlayer insulating film formed on said first interlayer insulating film; and diameter-reduced contact plugs which are smaller than said contact plugs and extend through said second interlayer insulating film to conduct to said contact plugs, respectively;

wherein said contact plugs and said gate electrode layers respectively have a doped silicon layer containing an impurity and a silicide film for covering the surface of the doped silicon layer, and said each diameter-reduced contact plug has a barrier metal brought into contact with the silicide film, and a metal layer formed on the barrier metal.

* * * * *